United States Patent
Murdeshwar

(10) Patent No.: US 6,180,891 B1
(45) Date of Patent: *Jan. 30, 2001

(54) CONTROL OF SIZE AND HEAT AFFECTED ZONE FOR FINE PITCH WIRE BONDING

(75) Inventor: Nikhil M. Murdeshwar, Apalachin, NY (US)

(73) Assignee: International Business Machines Corporation, Armonk, NY (US)

( * ) Notice: This patent issued on a continued prosecution application filed under 37 CFR 1.53(d), and is subject to the twenty year patent term provisions of 35 U.S.C. 154(a)(2).

Under 35 U.S.C. 154(b), the term of this patent shall be extended for 0 days.

(21) Appl. No.: 08/806,818

(22) Filed: Feb. 26, 1997

(51) Int. Cl.$^7$ ....................................................... H05K 1/16
(52) U.S. Cl. ....................... 174/260; 228/180.5; 361/776; 257/780; 438/617
(58) Field of Search ..................................... 174/260, 250; 228/180.5, 110.1; 361/767, 772, 773, 776; 257/693, 780, 784; 438/617

(56) References Cited

U.S. PATENT DOCUMENTS

| | | | |
|---|---|---|---|
| 4,098,447 | 7/1978 | Edson et al. | 228/4.5 |
| 4,387,283 | 6/1983 | Peterson et al. | 219/56.21 |
| 4,482,794 | 11/1984 | Kurtz et al. | 219/56.22 |
| 4,575,602 | 3/1986 | Sakurai | 219/56.21 |
| 4,705,204 | 11/1987 | Hirota et al. | 228/180.5 |
| 4,732,313 | 3/1988 | Kobayashi et al. | 228/180.5 |
| 4,772,498 | 9/1988 | Bertin et al. | 428/34.4 |
| 4,858,819 * | 8/1989 | Hill et al. | 228/179 |
| 5,016,803 | 5/1991 | Ohashi et al. | 228/4.5 |
| 5,119,436 * | 6/1992 | Holdgrafer | 382/8 |
| 5,221,037 | 6/1993 | Terakado et al. | 228/102 |
| 5,244,140 | 9/1993 | Ramsey et al. | 228/110.1 |
| 5,433,371 | 7/1995 | Morisako | 228/180.5 |
| 5,463,197 | 10/1995 | Miyazaki | 219/56.22 |
| 5,465,899 | 11/1995 | Quick et al. | 228/180.5 |
| 5,544,804 * | 8/1996 | Test et al. | 228/180.5 |
| 5,558,270 * | 9/1996 | Nachon et al. | 228/180.5 |
| 5,764,486 * | 6/1998 | Pendse | 361/774 |

* cited by examiner

*Primary Examiner*—Jeffrey Gaffin
*Assistant Examiner*—Kamand Cuneo
(74) *Attorney, Agent, or Firm*—McGuireWoods; Lawrence R. Fraley

(57) ABSTRACT

The amount of melting of the bonding wire is closely regulated, and reduction of size and improvement of uniformity of the free air ball is obtained for ball bonding at pitches of less than ninety mils even when bonding wire of reduced diameter is employed. Quenching of the bonding wire adjacent to the free air ball also limits the temperature rise in the bonding wire and the extent of a heat affected zone having less tensile strength and stiffness to less than one micron and with reduced grain enlargement. The present invention provides such a bond for electronic packaging of increased reliability, potential functionality, increased manufacturing yield and reduced process complexity.

4 Claims, 2 Drawing Sheets

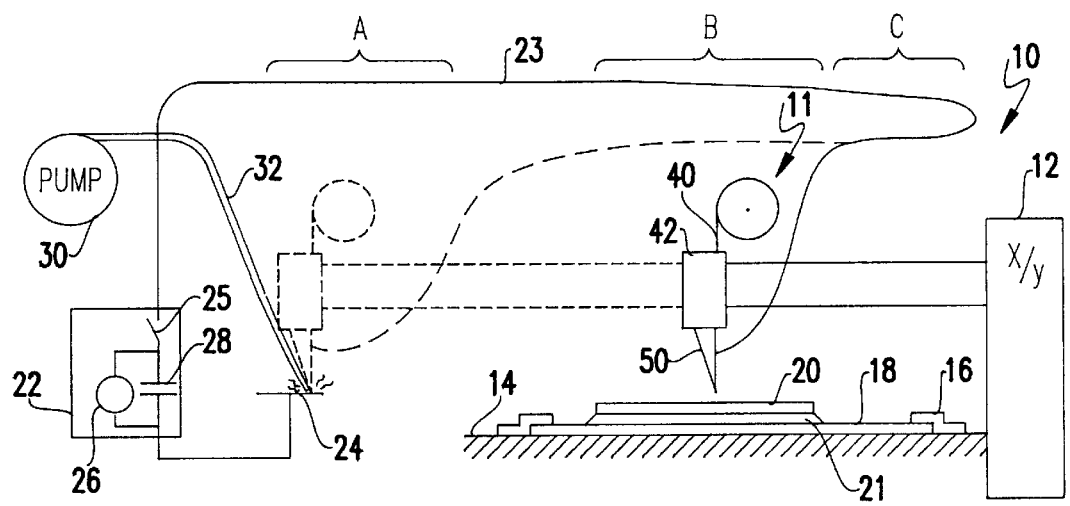
FIG. 1
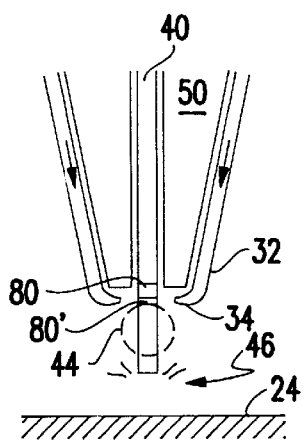
FIG. 2
(LOCATION A)
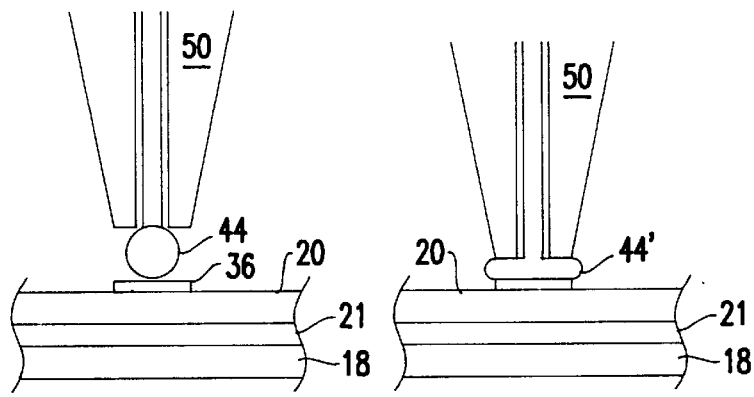
FIG. 3
(LOCATION B)
FIG. 4
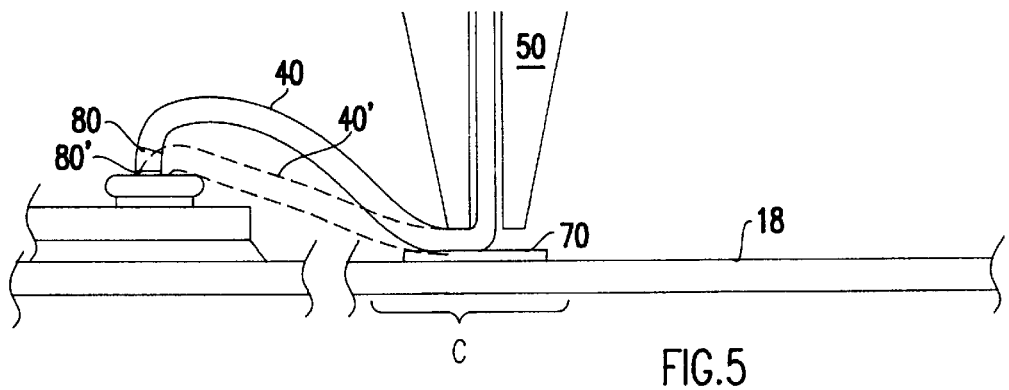
FIG. 5

CONTROL OF SIZE AND HEAT AFFECTED ZONE FOR FINE PITCH WIRE BONDING

BACKGROUND OF THE INVENTION

1. Field of the Invention

The present invention generally relates to wire bonding for a manufacturing process and, more particularly, ball wire bonding suitable for forming wire bonds at a fine pitch to integrated chips and package structures for fabrication of electronic devices.

2. Description of the Prior Art

Miniaturization of electronic devices provides not only manufacturing economies but provides performance enhancement by reducing signal propagation time between nodes of the electronic device. At the high performance levels which currently characterize modern digital circuits, design rules provide for extremely close spacing of components and connections therebetween. The vast majority of connections are therefore made on integrated circuit chips by lithographic processes as part of the integrated circuit design. However, many connections to integrated circuit chips are made by wire bonding. It is also possible, in view of the complexity and cost of manufacture of integrated circuits and modular packages, to repair connections on either by wire bonding.

In the past, wired connections have been accomplished by soldering or welding. At the current state of the art, however, many applications in which wire bonding is needed cannot tolerate either soldering or welding because of the size of the resulting bond or the heat budget of the device to which a connection must be made. Therefore, other forms of wire bonding have been developed.

Specifically, so-called thermal compression bonding has been developed in which a combination of heat and pressure causes a weld-like bonding of a wire to metallization on the chip or carrier substrate but with minimal, if any, melting of the metallization or wire. While thermal compression bonding produces high quality bonds, the process involves substantial temperature excursions and is slow; becoming economically impractical as the number of required wire bonds increases.

Ultrasonic bonding, sometimes referred to as wedge bonding, clamps a wire to a pad with a wedge or other structure which guides feeding of the wire and provides energy to complete the bond by ultrasonic vibration. This process may be conducted at a much higher repetition rate and much lower temperatures than thermal compression bonding. However, wire bonds formed by this technique are directional in that the axis of the wire is "wedged" parallel to the pad surface and obtaining the correct wire orientation in the plane of the pad surface is difficult and may require complex automated manipulations, including rotation of a mandrel-like transducer by which ultrasonic energy is applied and across which the wire is fed, which may slow the process significantly.

A third type of wire bonding to which the present invention is directed is referred to as thermosonic or ball bonding. This process preferably includes the application of some heat in addition to ultrasonic energy to form the bond, is far faster than wedge bonding because it is non-directional; a ball being formed on the end of the wire which will be attached to the chip so that the wire is oriented orthogonally to the chip as the bond is made. The other end of the wire bond is made to the carrier by wedge bonding as described above but since the wedge bond is formed subsequent to the wire bond to the chip, the direction of the wedge bond is established by the route of the wire, itself.

To reliably provide a volume of wire material located and formed such that it can be pressed against a pad with a so-called capillary through which the wire is dispensed, it is common to strike an electrical arc between the wire and another conductive surface completing a circuit much in the manner of electrical arc welding. The heat of the arc thus melts a small length of the wire which forms a so-called free air ball on the end of the wire. The cross-section of the free air ball in a direction orthogonal to the wire axis thus forms a flange-like feature which can be compressed against a pad by the capillary which also conducts ultrasonic energy to the ball for bonding with the bonding pad.

Therefore, it can be readily understood that the diameter of the free air ball determines the size of the contact area of the wire bond and can thus limit the pitch at which wire bonds can be formed. At the current state of the art a wire diameter of about 1.25 mils is used and the ball diameter developed is about 2.5 to 3.0 mils. Ball diameter is largely a function of the amount of energy in the arc that is struck which is roughly determined by the charging of a capacitor bank and the diameter of the wire which is the principal mechanism of conducting heat away from the ball.

Convection cooling of the ball and the wire is negligible and, during formation of the ball, the wire extends well past the capillary. The heat of the arc (and any resistive heating which may occur) is difficult to regulate from one free air ball formation to the next and therefore ball size will unavoidably vary within and beyond the range indicated above. Decrease of wire diameter will increase thermal resistance and increase variability of ball size with variability of arc heat. Further a threshold amount of energy will be required to reliably strike an arc to form the free air ball and this threshold cannot be scaled with wire diameter. Therefore, average minimum size as well as the variability of size of the free air ball may increase with decreasing wire size and, in any event, is uncontrolled.

It also follows that the temperature of a region of the wire adjacent to the free air ball may rise very close to the melting point of the wire material. Such heating causes annealing of a region of the wire adjacent to the free air ball which extends for some distance along the wire (a few microns) for a 1.25 mil (0.00125 inches or about 32 microns) wire but longer for smaller diameter wire. Annealing causes an increase in the size of metal grains in the grain structure of the wire and relieves internal stresses in the material of the wire, effectively causing the wire to become somewhat softer (e.g. more malleable) in a region called the heat affected zone (HAZ) over which some degree of annealing takes place. Further, annealing may cause the grain size to approach 1 mil which infers that a few grain boundaries may cover a significant portion of the cross-sectional area of a 1.25 mil wire within the HAZ and potentially the entire cross-section of the wire if wire diameter is reduced. It can thus be understood that annealing can also cause substantial weakening of fine wires which could then be broken by relatively small tensile forces which can occur during subsequent assembly processes.

Softening of the wire in the heat affected zone allows the wire to be more easily deformed (and aggravates reduction of wire stiffness as wire diameter is reduced). Thus the geometry of the wire routing is less readily controllable both during formation of the connection and thereafter until the wire bond is encapsulated to complete the packaging of the electronic device. Such deformations are generally referred to as sag (in a direction perpendicular to the connection surface), sweep (in a direction generally parallel to the bond surface) and "s-ing" which may be visualized as a deformation similar in shape to deformation caused by buckling under axial compression.

Since connections formed by wire bonding may cross and wire bonds may be formed closely adjacent each other, any of these deformations, alone or in any combination may potentially cause shorting between wires of respective connections. Insulation cannot be provided on the wire without contamination of the bonding surfaces. Therefore, wire bond connections may become shorted together as formed and are subject to damage due to even relatively slight accelerations or inadvertent contact with other structures before encapsulation can be performed or even due to viscous drag of applied materials during the encapsulation process itself.

As a partial solution in the past, the connections were formed in relatively tall loop configurations in which the portion of the connection which is not annealed is increased and additional path width is provided for flow of encapsulation materials. However, such a tall loop configuration actually increases the likelihood of shorting as wire bond connections are made closer together. Further, the mechanical advantage of forces from flow of encapsulating material is increased by the height of the loop and, while marginally tolerable for 1.25 mil wire, would cause collapse of such loops formed by thinner wire especially when made more malleable and weaker in the heat affected zone. Moreover, a greater height of encapsulation may compromise other processes such as package heat dissipation, post-assembly cleaning, solder connection pitch or second level attachment processes such as ball grid array (BGA) techniques.

It is important to appreciate that the integrated circuit chip or chips constitutes, by far, the most expensive portion of any electronic circuit package which may contain one or more of them. The economic advantage of miniaturization is largely based on the number of chips which can be fabricated on a wafer with the same set of process steps. Nevertheless, the functionality of any chip is limited by the capacity for conducting signals to it or away from it. Therefore, the potential for reduction of chip area is often limited by the area occupied by connection pads and wire bonding pads in particular.

Typical wire bonds can currently be reliably achieved at a pitch (e.g. center-to-center distance) of about 100 microns. However, for a given number of wire bond connections, a twenty percent reduction in pitch corresponds to about a one-third reduction in required chip area and cost of an individual chip. Conversely, for a given chip area, a twenty percent reduction in wire bond pitch corresponds to an increase in the number of wire bonds which can be formed of about fifty percent; corresponding to a substantial increase in the potential functionality of the chip. However, even for smaller reductions in wire bond pitch (e.g. to less than 90 microns) it is evident that more stringent tolerances will be required for free air ball diameter than can presently be produced by known techniques and that smaller diameter wire will be required which will increase the difficulty of obtaining uniform and reduced dimensions of free air balls. Reduced wire size will also tend to increase the size of the heat affected zone in the wire while making the malleability and weakness of the wire substantially more critical to manufacturing yield. Nevertheless, the functionality of chips which can be developed at the present and foreseeable state of the art will require wire bond pitches of 60 microns or less at which the size and uniformity of free air ball diameter and extent of the HAZ will be extremely critical and beyond the capability of current techniques notwithstanding the fact that significantly smaller wire diameter will be required.

SUMMARY OF THE INVENTION

It is therefore an object of the present invention to provide a method and apparatus for developing smaller and more uniform free air balls on wire for thermosonic ball bonding.

It is another object of the invention to provide a method and apparatus for reducing the extent of the heat affected zone (HAZ) during free air ball formation.

It is a further object of the invention to provide an apparatus and method for providing uniformity and reduction of size of both free air ball and HAZ dimensions for bonding wire diameters of less than 1.25 mils.

It is yet another object of the invention to provide a technique for performing thermosonic bonding at wire bond pitches of 60 microns or less as well as at larger pitches.

In order to accomplish these and other objects of the invention, a method of performing ball wire bonding is provided comprising the steps of applying heat to a terminal portion of a bonding wire, causing gas flow in the vicinity of the terminal portion of the bonding wire in sufficient volume to limit melting of the bonding wire, quench a free air ball formed from a melted terminal portion of the bonding wire and limit temperature rise of a portion of the bonding wire adjacent the free air ball, and applying energy to the free air ball to bond the free air ball to a bonding pad.

In accordance with another aspect of the invention, an apparatus for performing wire bonding is provided including an arrangement for melting a terminal portion of a bonding wire for forming a free air ball and an arrangement for limiting the portion of the bonding wire which is melted and limiting temperature rise of a portion of the bonding wire adjacent said free air ball.

In accordance with a further aspect of the invention, an electronic circuit package is provided including a chip carrier, a chip mounted on the chip carrier, and ball bonds of bonding wires to bonding pads on the chip at a pitch of less than ninety microns.

BRIEF DESCRIPTION OF THE DRAWINGS

The foregoing and other objects, aspects and advantages will be better understood from the following detailed description of a preferred embodiment of the invention with reference to the drawings, in which:

FIG. 1 is a schematic diagram of an apparatus for performing thermosonic wire bonding.

FIGS. 2, 3, 4 and 5 illustrate formation of a connection using thermosonic bonding.

DETAILED DESCRIPTION OF A PREFERRED EMBODIMENT OF THE INVENTION

Figure 6:
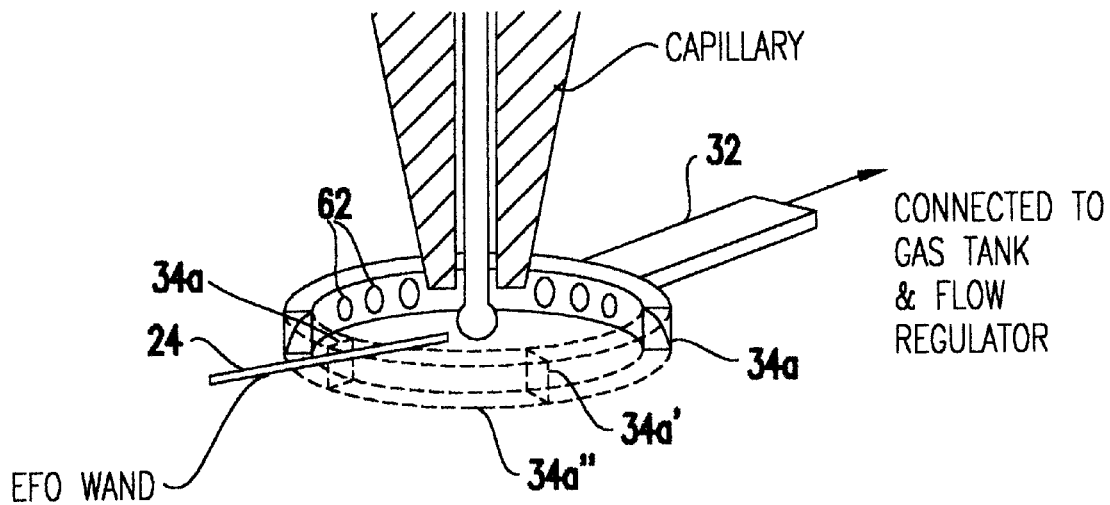
FIG. 6 illustrates a first and preferred embodiment of the invention in a partially cut-away perspective view.

Referring now to the drawings, and more particularly to FIG. 1, there is schematically shown an apparatus 10 for performing thermosonic bonding in accordance with the invention, particular steps of which are illustrated in enlarged form in FIGS. 2–5. It is to be understood that wire bonding is generally done with gold wire which is to be bonded to gold pads. In such a case, since gold does not oxidize, no enclosure for providing any particular atmosphere is required and none is shown in FIG. 1 in the interest of clarity. If other materials such as copper or aluminum are to be bonded, it is preferred to carry out wire bonding in an oxygen-free atmosphere such as nitrogen or argon gas and to provide a suitable enclosure to contain the gas. For example, since argon gas is heavier than air, a simple barrier to form a cup-shaped enclosure is adequate.

The apparatus 10 includes a bonding head 11, a transport mechanism 12 for moving the head relative to a conductive structure 24 at location A, a workpiece such as a chip 20 and carrier 18 at location B and a bonding pad at location C on carrier 18. The carrier 18 is retained on a stage 14 by any suitable arrangement such as clamps 16. The chip 20 is illustrated as being mounted on carrier 18 by solder, possibly applied as preforms or by a die attach adhesive, such as an epoxy adhesive, in a manner well-understood in the art and schematically depicted by reference numeral 21 but it should be understood that any other mounting arrangements such as lead frames or beam leads (which are also well-known in the art) could be used since only the formation of additional wire bonds is relevant to the practice of the invention. It is desirable, however, that relative motion between the chip 20 and carrier 18 be limited or avoided by the mounting technique and materials employed.

The bonding head 11 includes some provision for storing wire 40 and dispensing it through capillary 50 as well as a transducer 42 for providing ultrasonic energy thereto, details of which are unimportant to the practice of the invention. The capillary also carries an electrical connection 23 to a current pulse supply 22 including a power source 26, which preferably includes voltage regulation, and a capacitor bank or other energy storage structure 28. A capacitor bank is preferred since charging to a particular voltage will provide a known amount of charge for the arc current.

To form the free air ball, as shown in FIG. 2, bonding head 11 is relatively moved to location A, proximate conductive structure 24, known as an electric flame off (EFO) wand with which an arc is struck to wire 40. Conductive structure 24 is connected to power source 22 so that when an arc is struck upon closing switch 25 when wire 40 is close to the conductive structure 24 (or, preferably, briefly brought into contact therewith by a vertical component of movement of conductive structure 24), a circuit through conductor 23, capillary 50, wire 40, arc 46 and conductive structure 24 is formed. Heat from arc 46 (and some degree of resistive heating in wire 40 beyond the lower end of capillary 50) thus melts the end of wire 40 proximate arc 46.

Surface tension of the molten metal draws the molten metal into a spherical ball shape as indicated by dashed line 44 which is known as a free air ball which solidifies relatively quickly upon cooling. The temperature gradient near the free air ball causes annealing of the wire at temperatures near the melting point of the wire material and thus forms a heat affected zone 80.

In the interest of completeness, the remainder of the wire bonding process is performed as shown in FIGS. 3–5. Specifically, as shown in FIG. 3, the bonding head is brought to the position of a bonding pad 36 on chip 20 (or any other structure since wire bonding in accordance with the invention should not be considered as limited to wire bonding to a chip but may be applied to printed circuit boards, modular circuits and the like) and the free air ball 44, now terminating wire 40, is brought into contact therewith. The capillary is then lowered to apply force against the free air ball which exceeds the diameter of the capillary and ultrasonic energy is applied thereto.

As shown in FIG. 4, the application of ultrasonic energy softens the free air ball and bonding pad 36 such that the free air ball is flattened somewhat as shown at 44' as a bond to pad 36 is formed. It can thus be understood that the volume of the free air ball 44 determines the area and transverse dimension of the wire bond and thus may limit the pitch at which such bonds can be formed.

Then, as shown in FIG. 5, the bonding head 11 and capillary 50 are moved to a location C of a further bonding pad 70 on, for example, carrier 18 while dispensing wire 40 as necessary to limit tension on the wire bond formed as discussed above in regard to FIG. 3. The capillary is again lowered to apply pressure to the wire 40 which is thus wedged between the capillary 50 and the bonding pad 70 while ultrasonic energy is again applied to form a so-called wedge bond, alluded to above. The orientation direction of the wire is thus established by the configuration formed as the wire is dispensed during movement of the bonding head 11 between bonding pad 36 and bonding pad 70.

It should be noted from FIG. 5 that the wire is bent at HAZ 80 as the wire is dispensed and any tension which occurs will be concentrated on the outside of the wire 40 in this region.80. Therefore, breakage of the wire is likely along grain boundaries of enlarged grain structure in this region due to annealing. It can also be understood that the wire may be further deformed by sag, sweep or s-ing, as discussed above, and thus may come into contact with other wires or bonding pads of the chip 20 or carrier 18 due to malleability of the wire in the HAZ. Therefore, the extent of the HAZ 80 along wire 40 is directly related to the occurrence of either of these undesired effects.

Returning again to FIGS. 1 and 2, the invention further provides a pump 30 (or other source of a gas flow, such as a pressure tank and regulator) and conduit 32 for conducting a gas flow to one or more nozzles or a manifold as schematically depicted at 34 at the location at which the arc 46 is to be struck to apply heat to a terminal portion of the bonding wire 44. The nozzles are preferably located to direct air flow in a direction having a radial component around wire 40 at a vertical location at or preferably slightly above the center of the free air ball and between the center and top of the free air ball to limit temperature rise in the wire 40 above the free air ball 44.

The nozzles 34 can be simply provided at a fixed location A or carried by the capillary or formed integrally therewith or the capillary itself can be used as a nozzle. However, some wire bonding systems use a small air flow insufficient to the practice of the invention through the capillary to provide slow feeding of the bonding wire through the capillary by the viscous drag of the gas flow thorough the capillary against the wire. In such a system, increase of gas flow through the capillary may require some arrangement to restrain movement of the wire at higher gas flow rates that are sufficient to quench the free air ball.

Further, consistent with the small outside and inside diameters of the capillary required for wire bonding at fine pitch, the flow velocity to obtain a sufficient flow volume for quenching of the free air ball may approach or exceed a velocity sufficient to cause distortion of the free air ball from a spherical shape. Therefore, while the location of gas flow through the capillary may seem ideal for practice of the invention and limitation of temperature excursion in wire 40, flow through the capillary is not, in fact, preferred.

The gas may be at ambient temperature or somewhat lower (e.g. due to expansion) but the temperature is not critical to the practice of the invention as long as the temperature is much lower than the melting temperature of the material of wire 40. The content of the gas is also not important to the practice of the invention except that the gas should not significantly react with any material exposed to it. The volume of gas provided by the gas flow rate during the quenching period is also not critical and may be empirically determined in connection with particular arc energies as will be discussed below. The lower limit for flow rate may be determined in accordance with adequate confinement of the HAZ and the upper limit would correspond to gas flow velocities at which distortions of the free air ball can be observed.

When the arc 46 is struck to apply heat to a terminal portion of the bonding wire, the molten metal which is melted by the heat from the arc is quenched by the gas flow and heat transfer to the flow of gas predominates over conduction through the wire as a mechanism of cooling of the molten metal of the free air ball. By the same token, it is believed that a significant amount of heat is removed from the arc itself though possibly indirectly through the molten metal. Temperature rise due to resistive heating in wire 40 in the vicinity of the free air ball as it carries the arc current is also limited. Thus, by regulation of the gas flow within relatively wide process parameters the amount of wire which is allowed to melt is reduced for a given arc energy and free air ball size can be limited and made substantially uniform to permit wire bonding at pitches of less than 90 microns without complex or critical electrical apparatus or power supply regulation. As indicated above, however, a spherical shape of the free air ball is desirable and deformations and deflections of the free air ball 44 which could cause asymmetry of the wire bond 44' should be avoided by limitation of the gas flow velocity.

It should also be noted that the preferred gas flow rate volume (which is preferably empirically determined) is such that the mass (and thermal mass) of air flow while the free air ball 44 is molten, although potentially small, greatly exceeds the mass (and thermal mass) of wire exposed to the arc and the temperature of the wire 40 at an arbitrary distance from the end thereof can be kept low even if the energy of the arc is somewhat increased. Therefore, for a given tolerance of voltage regulation, charge storage and arc current, the amount of energy in the arc can be increased while excess heat is removed in accordance with the invention such that the effect of unavoidable variation in arc energy can be made arbitrarily small relative to the total arc energy. Thus the invention also provides for greatly improved uniformity of dimensions of the free air ball at reduced size with wire of reduced diameter. The increase of uniformity increases with the amount of heat which can be removed from the molten metal and/or the arc and the increase of arc heat relative to unavoidable variation in the energy thereof without reaching gas flow velocities which deform or distort the free air ball.

FIG. 5 shows a comparison of the HAZ 80' produced in accordance with the invention and the HAZ 80 which would have been produced in the absence of quenching. That is the ability to maintain a low temperature of the wire arbitrarily close to the molten region of the wire serves to confine the HAZ to a small region 80' of much reduced thickness (e.g. less than one micron) compared with HAZ 80 which is generally of a thickness of several microns and tends to be greater when bonding wire of smaller diameter is used. Quenching of the free air ball also tends to maintain small grain size and effects of annealing are much reduced in terms of malleability and tensile weakness of the wire. HAZ 80' can be thus maintained very thin and comparable to the original grain size in wire 40 which may also reduce the amount of increase of grain size. Further, the location may be kept close to the free air ball 44 and the flattening thereof during formation of the bond may produce some degree of work hardening in the thin HAZ 80', reducing malleability.

Therefore, the stiffness of the wire 40 can be maintained over a much increased portion of its length if not effectively the entirety thereof reducing susceptibility to deformation by sag, sweep and s-ing or damage from accelerations or inadvertent contact with other structures. Further, reduction of tensile strength in the HAZ 80' is lessened and more tension can be tolerated in dispensing of wire 40 resulting in a shortened wire connection and generically depicted at 40' which has less tendency to sag and sweep or to be deflected by flow of encapsulating material. The connection is also lower and proximate to the surface of the workpiece (e.g. chip) and encapsulation can be made correspondingly thinner with corresponding improvements in heat dissipation and reduction of process complexity, noted above.

Referring now to FIG. 6, a preferred form of structure for directing gas flow onto the free air ball is shown in which the nozzles 34, schematically illustrated in FIG. 2, are formed by apertures 62 in an annular manifold 34a, illustrated in partially cut-away form with the cut-away portion being indicated by phantom lines. It should be noted that in this embodiment gas tube 32 is not routed along the exterior of the capillary, as shown in FIG. 2, but generally parallel to the plane of relative movement of bonding head 11 and capillary movement as would be appropriate to the manifold being placed at a fixed location A, as is preferred to reduce the mass of the bonding head 11 which may be subjected to rapid movement. In this case, the manifold should preferably not be fully annular but terminated at locations 34a' to form a gap through which the capillary can pass without vertical movement. Apertures 62 opposite the gap can be omitted to preserve symmetry of air flow around the free air ball. On the other hand, if the manifold 34a is carried by the bonding head 11, a fully annular manifold is preferred for symmetry of gas flow with a maximum number of apertures to provide sufficient gas flow volume at minimum velocity. Likewise, if relative movement of the table 14 and bonding head 11 is produced by movement of stage or table 14, as is currently preferred for the practice of the invention, the manifold or nozzles 34 may be fixed in location (and do not contribute to the mass of the bonding head which still reciprocates vertically) while being fully annular since it would not be required for the bonding head 11 to traverse the periphery of the manifold or nozzles. In other words, in this latter case, location A of FIG. 1, which is illustrated as separated from locations B and C in the interest of clarity, would fall within location B and/or location C as may be dictated by the motion of the table or stage 14.

Figure 7:
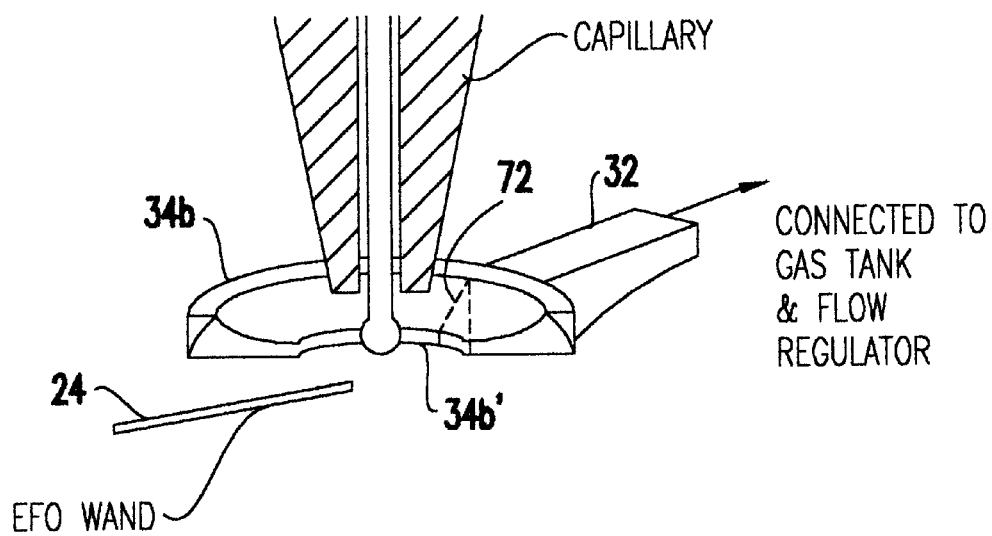
FIG. 7 illustrates a variant form of the invention in a partially cut-away perspective view.

An alternative form of nozzles 34 is illustrated in FIG. 7 in partially cut-away form. In this variation of the invention, manifold 34b is shaped in cross-section to form an annular gap 34b' to direct gas flow as described above. Manifold 34b may be fully annular or formed with a gap (corresponding to terminations 34a') as described above as may be required or convenient to the mounting arrangement and location of the manifold and portions of annular gap 34b' may be closed to provide symmetry of gas flow. Further, baffles 72 may be included to assure substantially radial gas flow or otherwise direct gas flow as may be desired and provide mechanical stability for the annular gap 34*b'*.

It should be recognized that the use of baffles 72 effectively articulates the manifold 34*b* and gap 34*b'* into a plurality of nozzles 34, as described above and which may be individually further directed or constricted as desired in accordance with the principles of the invention. For example, it may be desired to form portions of the manifold to direct gas flow in a radial or slightly downward direction while directing others upward toward the portion of the wire 44 above the free air ball. Similar direction of the plural nozzles formed by orifices 62 of FIG. 6 can be provided by angling of the orifices within the thickness of the wall of manifold 34*a* or choice of location of orifices 62 thereon.

In view of the foregoing, it is seen that the invention provides for reduced size and increased uniformity of the free air ball which is formed incident to thermosonic wire bonding using wire diameters much less than 1.25 mils. Therefore wire bonds can be formed in accordance with the invention at much finer pitch than has heretofore been possible. The extent of the HAZ is also limited and its location kept immediately adjacent to the free air ball. Effects of annealing in the HAZ are also minimized. Accordingly, sag and sweep can be minimized even during the encapsulation process and thinner encapsulation can be employed.

While the invention has been described in terms of a single preferred embodiment, those skilled in the art will recognize that the invention can be practiced with modification within the spirit and scope of the appended claims.

Having thus described my invention, what I claim as new and desire to secure by letters patent is as follows:

1. A product including
    a first surface,
    a second surface,
    a first bonding wire having a first end bonded to a first portion of said first surface by a ball bond and a second end bonded to a first portion of said second surface,
    a second bonding wire having a first end bonded to a second portion of said first surface by a ball bond and a second end bonded to a second portion of said second surface, wherein the pitch between said ball bond on said first bonding wire and said ball bond on said second bonding wire on respective ones of said first and second portions of said first surface is less than 90 microns and volume of free air balls forming said ball bonds is substantially uniform.

2. A product as recited in claim 1, wherein said product is an electronic circuit package,
    said first and second portions of said first surface are bonding pads on a chip, and
    said first and second portions of said second surface are bonding pads on a chip carrier.

3. An electronic circuit package as recited in claim 2, wherein annealing associated with said ball bonds is confined to a thickness of less than one micron.

4. An electronic circuit package as recited in claim 2 wherein said bonding wires are of a diameter of less than one mil.

* * * * *